United States Patent [19]
Graves et al.

[11] Patent Number: 6,058,019
[45] Date of Patent: May 2, 2000

[54] ELECTRONIC CIRCUIT CARD ASSEMBLY HAVING CONFINED GROUND PATH RETURN

[75] Inventors: Scott Peter Graves, Zumbro Falls; Maurice Leron Hutson, Byron; Douglas Allan Kuchta; Paul Steven Severson, both of Rochester, all of Minn.

[73] Assignee: International Business Machines Corporation, Armonk, N.Y.

[21] Appl. No.: 09/184,903

[22] Filed: Nov. 3, 1998

Related U.S. Application Data

[63] Continuation-in-part of application No. 09/082,897, May 21, 1998.

[51] Int. Cl.[7] .................................................. H05K 5/02
[52] U.S. Cl. ...................... 361/760; 361/685; 361/788; 361/799; 174/51; 439/61; 312/223.1; 312/223.2
[58] Field of Search .................................... 361/760, 685, 361/683, 727, 686, 724, 788, 799; 174/51; 439/61, 65; 312/223.1, 223.2

[56] References Cited

U.S. PATENT DOCUMENTS

| | | | |
|---|---|---|---|
| 4,967,311 | 10/1990 | Ferchau et al. | 361/736 |
| 5,006,961 | 4/1991 | Monico | 361/788 |
| 5,220,490 | 6/1993 | Weigler et al. | 361/777 |
| 5,282,112 | 1/1994 | Bremer | 361/729 |
| 5,352,123 | 10/1994 | Sample et al. | 439/61 |
| 5,379,184 | 1/1995 | Barraza et al. | 361/685 |
| 5,495,397 | 2/1996 | Davidson et al. | 361/784 |
| 5,652,697 | 7/1997 | Le | 361/788 |
| 5,680,295 | 10/1997 | Le et al. | 361/695 |
| 5,717,570 | 2/1998 | Kikinis | 361/785 |
| 5,808,237 | 9/1998 | Hancock | 174/35 R |
| 5,808,876 | 9/1998 | Mullenbach et al. | 361/788 |
| 5,822,184 | 10/1998 | Rabinovitz | 361/685 |
| 5,865,518 | 2/1999 | Jarrett et al. | 312/223.2 |
| 5,912,799 | 6/1999 | Grouell et al. | 361/685 |
| 5,931,550 | 8/1999 | Chen | 312/244 |

*Primary Examiner*—Leo P. Picard
*Assistant Examiner*—David Foster
*Attorney, Agent, or Firm*—Roy W. Truelson

[57] ABSTRACT

An electronic system contains a backplane circuit card assembly for distribution of electrical signals among component devices. Power is distributed in embedded power planes, one of which is associated with ground. The backplane also contains multiple embedded ground planes. The circuit card assembly is divided by an axis into two halves, each half receiving and consuming approximately equal power. Electrical couplings for power sources and power planes in each half of the backplane are located symmetrically with respect to the axis. A row of ground vias along the axis couples the ground planes to the associated power plane. At all other locations on the backplane, the ground planes are electrically isolated from the associated power plane. Preferably, the backplane assembly comprises a pair of base cards, connected by a single smaller jumper card in which all ground vias are located. Each base card lies on a respective side of the axis, the jumper straddling the axis. The exemplary embodiment is an intelligent redundant array of independent disks (RAID) storage server having concurrent maintenance capability.

7 Claims, 14 Drawing Sheets though not essential to the claims of the invention, it should be understood that any or all of these features could be altered in any combination, without departing from the scope of the invention.

ELECTRONIC CIRCUIT CARD ASSEMBLY HAVING CONFINED GROUND PATH RETURN

RELATED APPLICATION

The present application is a continuation-in-part of U.S. patent application Ser. No. 09/082,897, filed May 21, 1998, by Douglas A. Kuchta et al., entitled "Multi-Part Concurrently Maintainable Electronic Circuit Card Assembly", which is herein incorporated by reference.

The present application is related to commonly assigned copending U.S. patent application Ser. No. 09/146,010, filed Sep. 2, 1998, by Maurice L. Hutson et al., entitled "Electronic Circuit Card Having Transient-Tolerant Distribution Planes", which is herein incorporated by reference.

FIELD OF THE INVENTION

The present invention relates to electronic circuit cards, and in particular to "backplane" cards of a type used to distribute power or other signals to other attached modules.

BACKGROUND OF THE INVENTION

The spectacular proliferation of electronic devices, particularly computers, in modern society, both in numbers and complexity, demands that such devices satisfy ever increasing standards of reliability and serviceability to avoid degeneration into chaos. In the early days of the computer industry, relatively high failure rates and corresponding "down time" when the computer system was unavailable to perform useful work were accepted as the norm. As the industry has matured, computers have become more reliable, and users have come to depend on these systems being available when needed. This dependence has become so profound that, for many businesses, the mere unavailability of the computer system for any appreciable length of time can cause significant commercial injury.

In the early days of the computer industry, a computer component was replaced by shutting off power to the system, replacing the component, and re-powering the system. This is, of course, a logical way to fix a toaster, but the complexity of modern computers makes this undesirable. It is not possible to simply shut off power and turn it back on as one would a light bulb. A computer system's state and data must be saved when it is powered down. Its software must be re-loaded, and its state restored, when it is re-powered. For a large modern computer system, these operations can take a very significant amount of time, during which the system is unavailable to its customers.

Computer manufacturers are well aware of the dependence of their customers, and have accordingly devoted considerable attention to these problems. As a result, many modern computer system have some degree of fault tolerance, and are capable of concurrent maintenance. Fault tolerance means simply that a single component of the computer system may fail without bringing the entire system down, although in some cases performance of the system or some other characteristic may be adversely affected. Concurrent maintenance is the capability to repair or replace some component of a computer system without shutting down the entire system, i.e., the system can continue to operate and perform useful work (although possibly in a diminished capacity) while the repair is being performed. A system which is both fault tolerant and capable of concurrent maintenance can, in theory, be kept running 24 hours a day for an indefinite length of time. In fact few, if any, systems achieve this level of reliability with respect to every component which may possibly fail.

One example of this type of fault tolerance is an array of storage devices known as a "RAID", i.e. redundant array of independent disks. A RAID stores data on multiple storage devices in a redundant fashion, such that any data can be recovered in the event of failure of any single storage device in the array. RAIDs are usually constructed with rotating magnetic hard disk drive storage devices, but may be constructed with other storage devices such as optical drives, tape drives, etc. Various types of RAIDs providing different levels of redundancy or other operating characteristics are described in a paper entitled, "A Case for Redundant Arrays of Inexpensive Disks (RAID)", by Patterson, Gibson & Katz, presented at the ACM SIGMOD conference (June, 1988). Patterson, et al., classify five types of RAID, designated levels 1 through 5. The Patterson nomenclature has become standard in the industry. RAIDs have proliferated to the point where an industry trade group called the RAID Advisory Board has attempted to establish standards for RAID characteristics. Further information regarding RAIDs can be found in *The RAIDbook, A Source Book for Disk Atray Technology*, published by the RAID Advisory Board (5th Ed. February 1996).

Frequently, a RAID is manufactured and marketed as a stand-alone storage subsystem, which is housed in its own cabinet with its own power supply and supporting hardware and software, and which communicates through a standard communications interface with a host computer system. Since it is desirable to make data available to the host system at all times, even if a single storage device in the RAID subsystem fails, the subsystem will frequently have its own on-board data recovery capability, which may include temporary spare drives for storage of recovered data. The RAID subsystem may additionally have redundant power supplies or other redundant components.

Electronic systems frequently use backplane circuit cards for distribution of power, data signals, and/or mounting of active or passive circuit elements and connectors. Such a card typically contains multiple parallel layers for embedded circuit patterns, grounds, or power distribution. Pluggable connectors couple the backplane to other modules which make up the electronic system, such as power supply modules, storage devices, or logic cards. Often, such a backplane card acts primarily as a distribution medium, i.e., it conveys power and/or data signals from one module to another, and contains relatively few functional components attached directly to the backplane itself. However, the backplane may contain functional components.

A backplane may contains embedded power planes for distributing electrical power to pluggable modules or other attached devices. It may also contain a multiple ground planes. Typically, one of the power planes (e.g., 0 V) is associated with ground, and must be grounded. Grounding means that electrical paths of negligible resistance are created between ground planes and the 0 V power plane. The existence of such paths can cause parasitic current to flow in the ground planes, which lowers the noise immunity of the system.

It is desirable to reduce the parasitic current flowing in the ground planes of a backplane circuit card, particularly a backplane which distributes power to multiple pluggable modules.

SUMMARY OF THE INVENTION

It is therefore an object of the present invention to provide an enhanced electronic system.

Another object of this invention is to provide an enhanced backplane circuit card for use in electronic systems.

Another object of this invention is to reduce the parasitic current flowing in ground planes of a backplane circuit card.

An electronic system, such as a digital computer system or a subsystem thereof, contains a backplane circuit card assembly for distributing power and/or data signals among component devices. Power is distributed in embedded power planes, one of the power planes being associated with ground. The backplane also contains multiple embedded ground planes. The circuit card assembly is divided by an axis into two halves, each half consuming approximately equal power, and each half receiving approximately equal power from a power source. The electrical couplings between power sources and power planes of the circuit card assembly in each half of the backplane are located symmetrically with respect to the axis. A row of ground vias located along the axis couples the ground planes to the associated power plane. At all other locations on the backplane, the ground planes are electrically isolated from the associated power plane.

Preferably, the backplane assembly comprises a pair of base cards, connected by a single smaller jumper card. The base cards are positioned in a single plane, with one edge of each base card lying near a corresponding edge of the other base card. The jumper is positioned parallel to and slightly offset from the base cards, the offset being needed to provide space for pluggable connectors which couple the jumper card to each of the base cards. Each base card lies on a respective side of the axis, the jumper straddling the axis. All ground vias are located in the jumper.

In the preferred embodiment, the electronic system includes multiple redundant power supply modules for supplying electrical power, and multiple redundant functional modules which perform some data processing function. Modules plug into the backplane card assembly using pluggable connectors capable of being unplugged and re-plugged. Each base card distributes electrical power from at least one power supply module directly coupled to it, i.e., without power coming through the other base card. Each base card further carries data signals among various modules coupled to it, independently of the other card. The power supply and functional modules directly attached to any one base card are sufficient to maintain minimum functionality of the electronic system, in the absence of the other base card.

The jumper preferably carries power and data signals between the two base cards. Thus, it is possible for electrical current generated by a power supply attached to one of the base cards to pass through the jumper and provide power to functional modules plugged into the other base card. It is further possible for a functional module attached to one base card to communicate through the jumper with a functional module attached to the other base card. Such capability may improve the performance of the system, but it is not necessary for minimum system functionality.

Preferably, each base card and the jumper card contain embedded power planes for distribution of electrical power. The power planes preferably contain "islands" in the vicinity of the pluggable connectors for the reduction of transients when modules are plugged or unplugged with the system powered on.

In the preferred embodiment, the electronic system is an intelligent redundant array of independent disks (RAID) storage server, for providing data to multiple host digital data processing systems. The storage server includes a plurality of disk drives and power supplies housed within an enclosure, together with supporting electronic logic cards and other hardware. The various components provide redundant operation in the event of a single failure. Certain logic cards, power supplies and other modules plug into the backplane circuit card, which functions as a distribution medium for power and data signals. The design of the server system, including the design of backplane circuit card and couplings, supports concurrent maintenance, whereby any component can be unplugged from the backplane circuit card, removed from the enclosure, and replaced with a functioning unit, all without powering down the subsystem. Additionally, the backplane itself is split into multiple circuit cards having duplicative function as described above, so that concurrent maintenance can be performed on the backplane itself.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1:
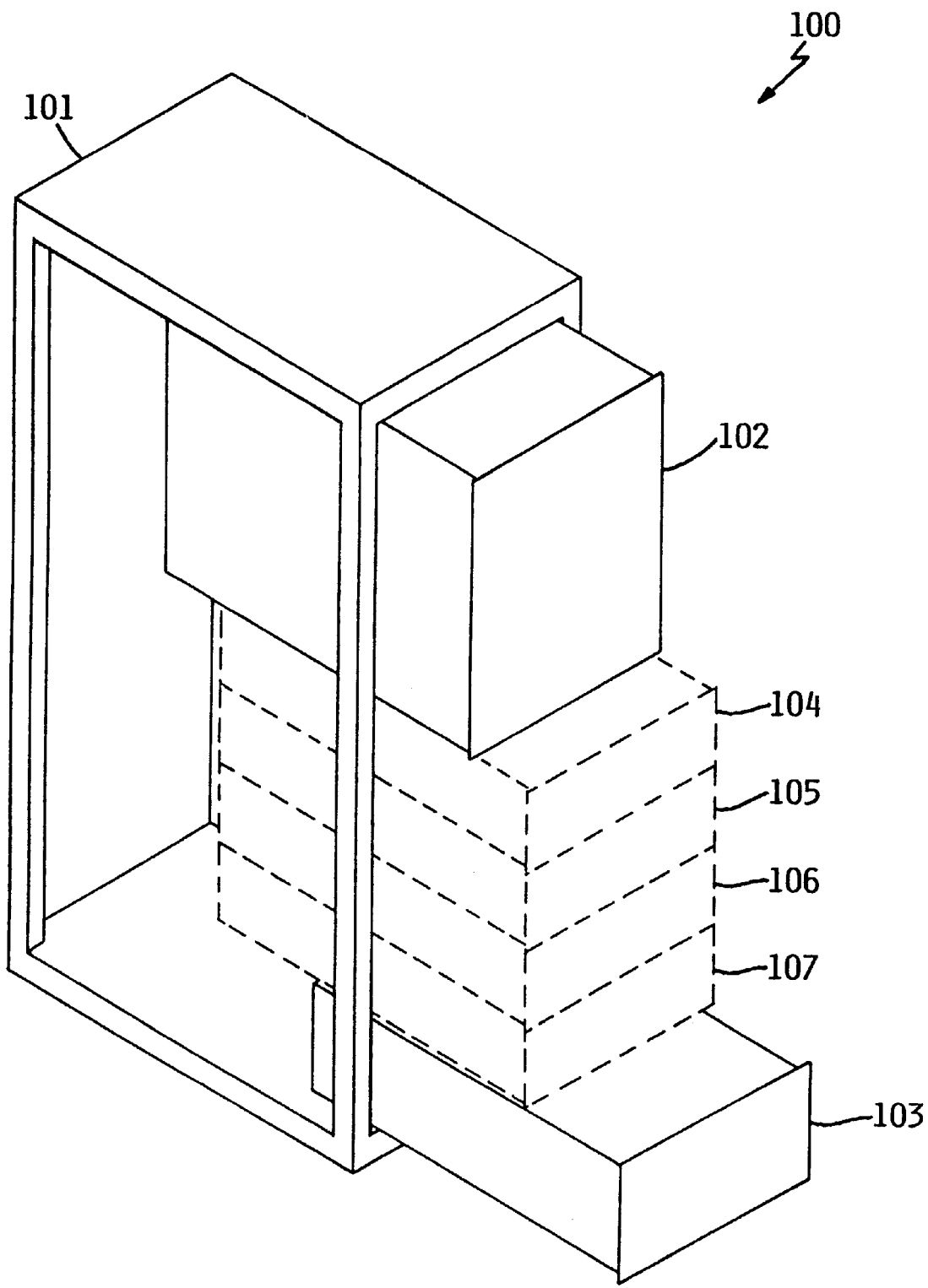
FIG. 1 shows the major components of a RAID subsystem using a backplane circuit card in accordance with the preferred embodiment of the present invention.

FIG. 1 is a high level representation of the major components of server system 100 employing the backplane circuit cards of the present invention, in accordance with the preferred embodiment. In this embodiment, server system is an intelligent and redundant mass repository of data, which it provides on demand to multiple host computer systems which are connected to server system 100. System 100 comprises a frame 101 for housing various electronic modules. These modules are shown in FIG. 1 in slide-out position for illustrative purposes, it being understood that during normal operation the modules are fully inserted in frame 101.

Near the top of the interior of frame 101 is electronics drawer assembly 102. Electronics drawer 102 provides the basic logic and memory functions for operation of system 100. The components and function of electronics drawer 102 are explained in greater detail below with respect to FIG. 2.

At the bottom of frame 101 is power drawer 103, which converts power from an external source to a voltage which is distributed to the various drawers. Specifically, power drawer 103 contains a pair of redundant power supplies, each power supply converting standard AC line voltage to 350 VDC for internal distribution within frame 101. Separate power distribution cables run from each power supply in power drawer 103 to electronics drawer 102 and each storage drawer 104–107, so that 350 VDC power is provided to each drawer in a redundant fashion, enabling system 100 to continue operation even if one of the 350 VDC power supplies fails.

Beneath electronics drawer 102 are several storage drawers 104–107, each of which may contain multiple rotating magnetic disk storage devices for storing data. The multiple rotating magnetic disk storage devices store data in a redundant fashion, according to one or more RAID levels. Additionally, electronics drawer 102 contains hardware and software necessary to reconstruct data stored in any non-functioning disk storage device, and to store this data on a spare or replacement storage device. Thus, data stored on system 100 is available, even though the storage device on which the data was stored is itself incapable of providing the data.

Figure 2A:
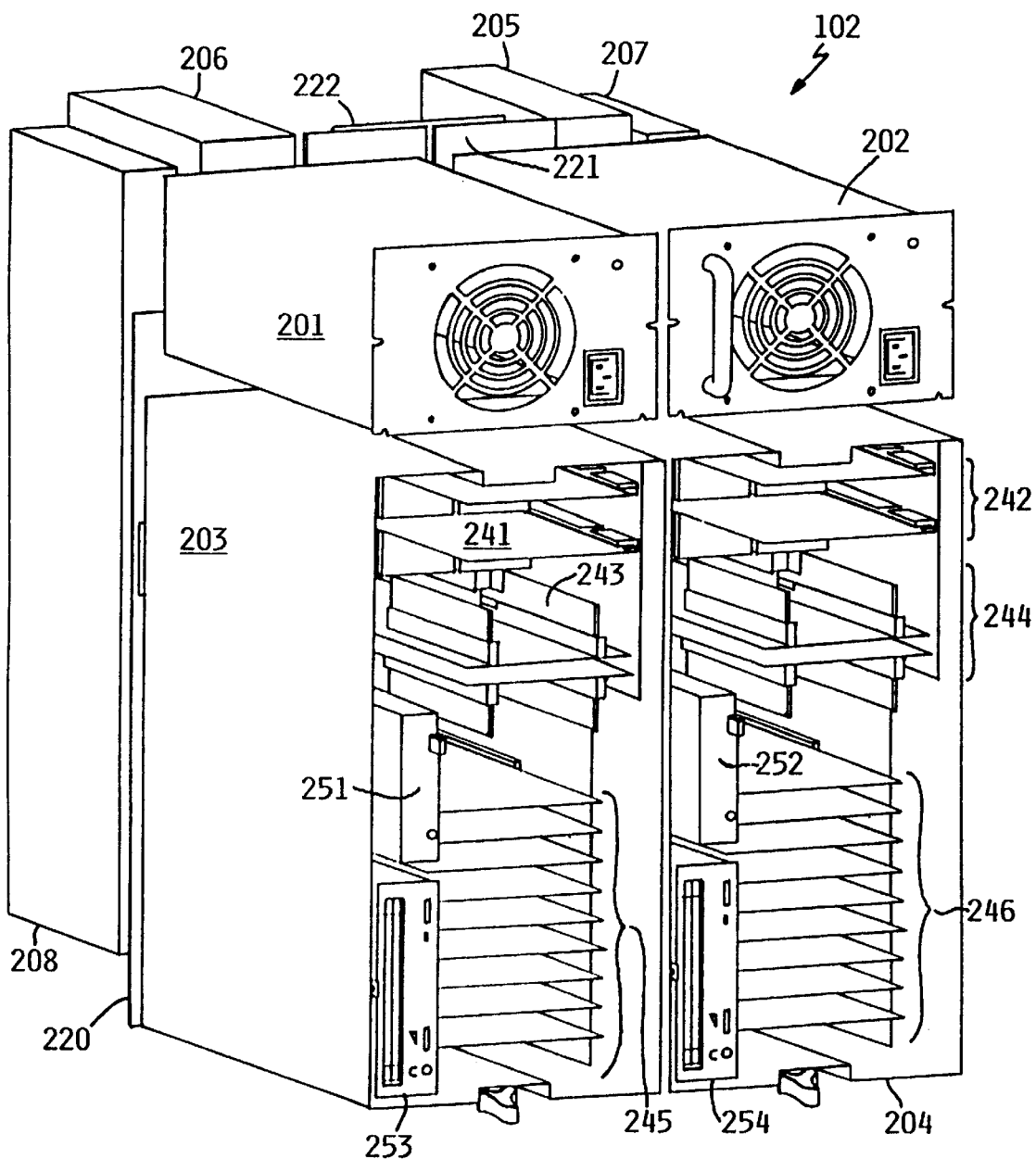
FIGS. 2A and 2B are isometric perspective views of the electronics drawer according to the preferred embodiment.
Figure 2B:
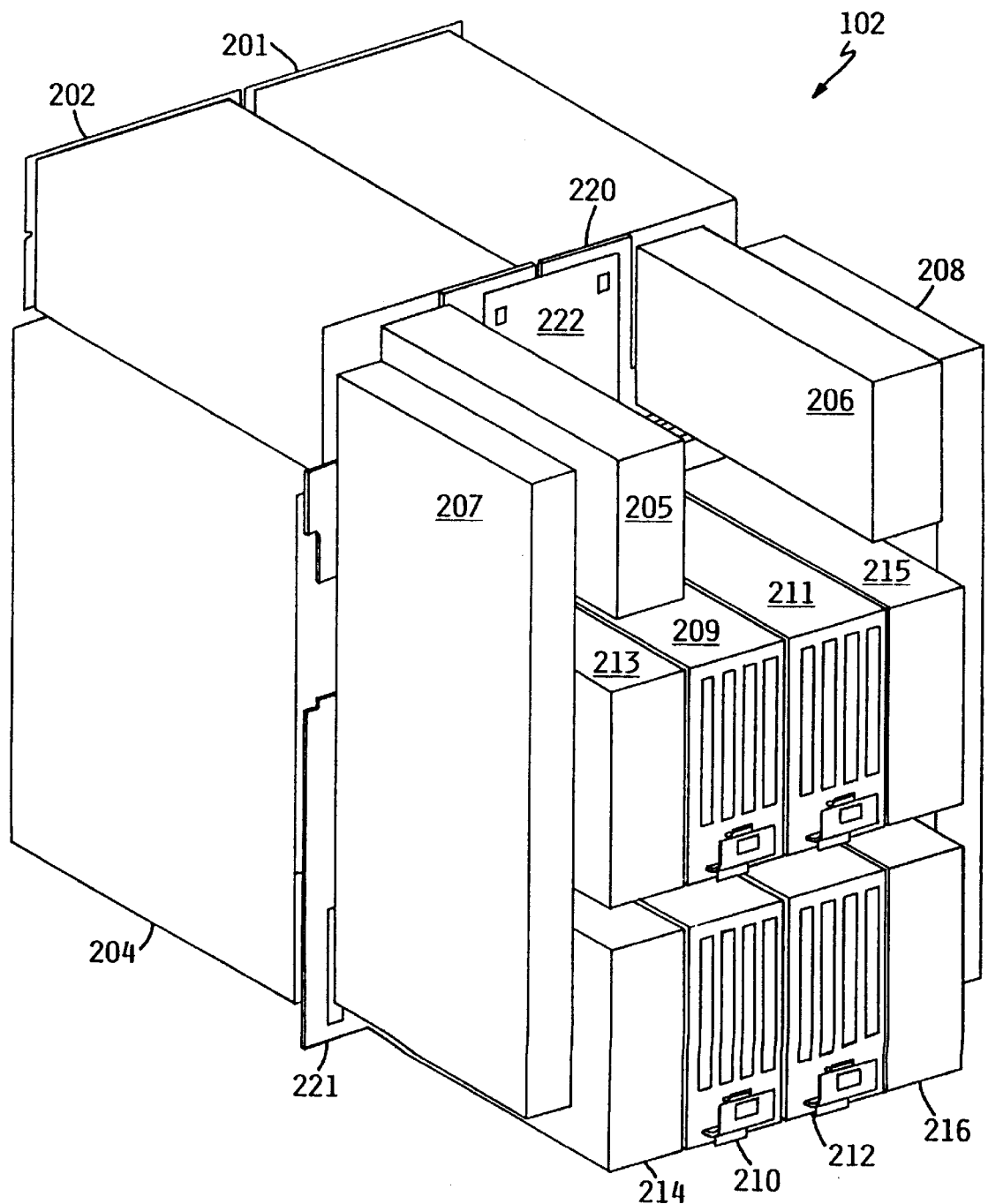

FIGS. 2A and 2B show in greater detail the major interior functional components of electronics drawer assembly 102. FIG. 2A is an isometric perspective front view of electronics drawer 102, while FIG. 2B is an isometric perspective rear view of drawer 102. In general, drawer 102 is housed in a frame (not shown) and includes left and right halves, the functional components of drawer 102 being duplicated in each half. Drawer 102 includes left power supply 201 and right power supply 202. These are essentially identical units, each of which receives 350 VDC power from power drawer 103, and converts it to 48 VDC power for distribution within electronics drawer 102.

Drawer 102 further includes left card cage 203 and right card cage 204. Card cages 203, 204 are essentially duplicates of each other, and house electronic circuit cards and other modules which perform the basic logical functions of system 100. Specifically, left cage 203 includes processor cards 241 which form the central processing unit (CPU), memory cards 243 which store programs and other data for processing by the CPU, I/O cards 245 which provide an interface between I/O devices and modules and a system bus, diskette drive 251 and CD/ROM drive 253. Cage 203 further includes a rotating magnetic hard disk drive, which is not visible. Right cage 204 similarly includes processor cards 242, memory cards 244, I/O cards 246, diskette drive 252, CD ROM drive 254, and hard disk drive (not shown).

The rear side of drawer, visible in FIG. 2B, includes right and left I/O communication modules 209–212. I/O modules 209–212 communicate with one or more host computer systems over a local area network or other medium, and/or communicate with storage devices located in drawers 104–107, handling the transfer of data between drawer 102 and the storage devices. I/O modules 209–212 may optionally communicate with additional storage devices located in drawers in adjacent racks (not shown). Data communication cables (not shown) exit the rear of modules 209–212 to connect the modules with their respective hosts, storage devices, or other devices.

Drawer 102 further includes reserved spaces for later system enhancements, depicted in FIGS. 2A and 2B as modules 205–208 and 213–216. Modules 213–216 are intended as additional I/O communications modules, similar in function to modules 209–212. Modules 205 and 206 are intended as optional performance enhancement modules, which may include cache and other logic to increase the performance of the storage subsystem. Modules 207 and 208 are intended as additional non-volatile random access memory (NV RAM), which temporarily store data bound for storage devices located in storage drawers 104–107. Modules 205–208 and 213–216 are shown in FIGS. 2A and 2B although in fact they are not supported by the backplane card design of the preferred embodiment. Support for these modules may require modifications to backplane sections 220 and 221 so that the backplanes would mount connectors supplying power and data signals to the modules.

Modules are electrically connected to one another for distribution of power and data signals by means of a three-part system backplane, comprising left backplane circuit card section 220, right backplane circuit card section 221, and backplane jumper card section 222. As used herein, the term "module" includes any electronic subassembly, such as circuit cards and card cages, as well as fully enclosed modules. Left section 220 and right section 221 are similar, and provide essentially duplicative function. I.e. left section 220 couples the various modules located on the left side of drawer 102, providing power to the modules and permitting data to flow between modules. Right section accomplishes the analogous task for the modules on the right side of drawer 102. Jumper section 222 is smaller than either section 220 or 221. Jumper 222 electrically connects the other two sections, allowing signals to pass between them and distributing power, and provides grounding connections, as explained further herein. Dividing the backplane into two separate sections linked by a jumper, each having duplicative function, makes it possible to replace one of the backplane sections while the other continues to function. While it would have been possible (and generally cheaper) to provide a single larger backplane circuit card, the three part design enhances the concurrent maintenance capability of the system.

The two functional halves of electronics drawer 102 are capable of independent operation, although they are linked by a data communication path across jumper 222. Each half has its own independent connection with a host system, so that each half can independently receive or transmit data from the host. Each has its own independent power. Each has its own independent bus connection to the storage devices. Preferably, the storage devices buses are configured as inherently redundant loops using IBM's Serial Storage Architecture, each bus being coupled to bus interfaces in both halves of electronics drawer 102, so that either half of the drawer can access any arbitrary storage device. Finally, each half of drawer 102 has its own processor and memory for processing commands from a host, issuing commands to storage devices, transmitting and caching data, performing parity or other error correction and detection calculations, performing error recovery and diagnostics, and other subsystem functions. In normal operating mode, storage access requests from a host will be allocated between the two halves based on the storage device accessed, address range, or other criteria, so that ideally each half is doing roughly equal work. Each half will thus independently handle a portion of the data access. The communications path between halves may be used for cache coherency, parity calculations, status information, diagnostics, etc. In the event any half of drawer 102 is non-functional for any reason, the remaining half will handle all data access requests from the host to any storage device. Because there will only be one processor and associated hardware to handle all storage access requests (where there are normally two), this may result in lowered performance. However, the system will remain operational.

Figure 3A:
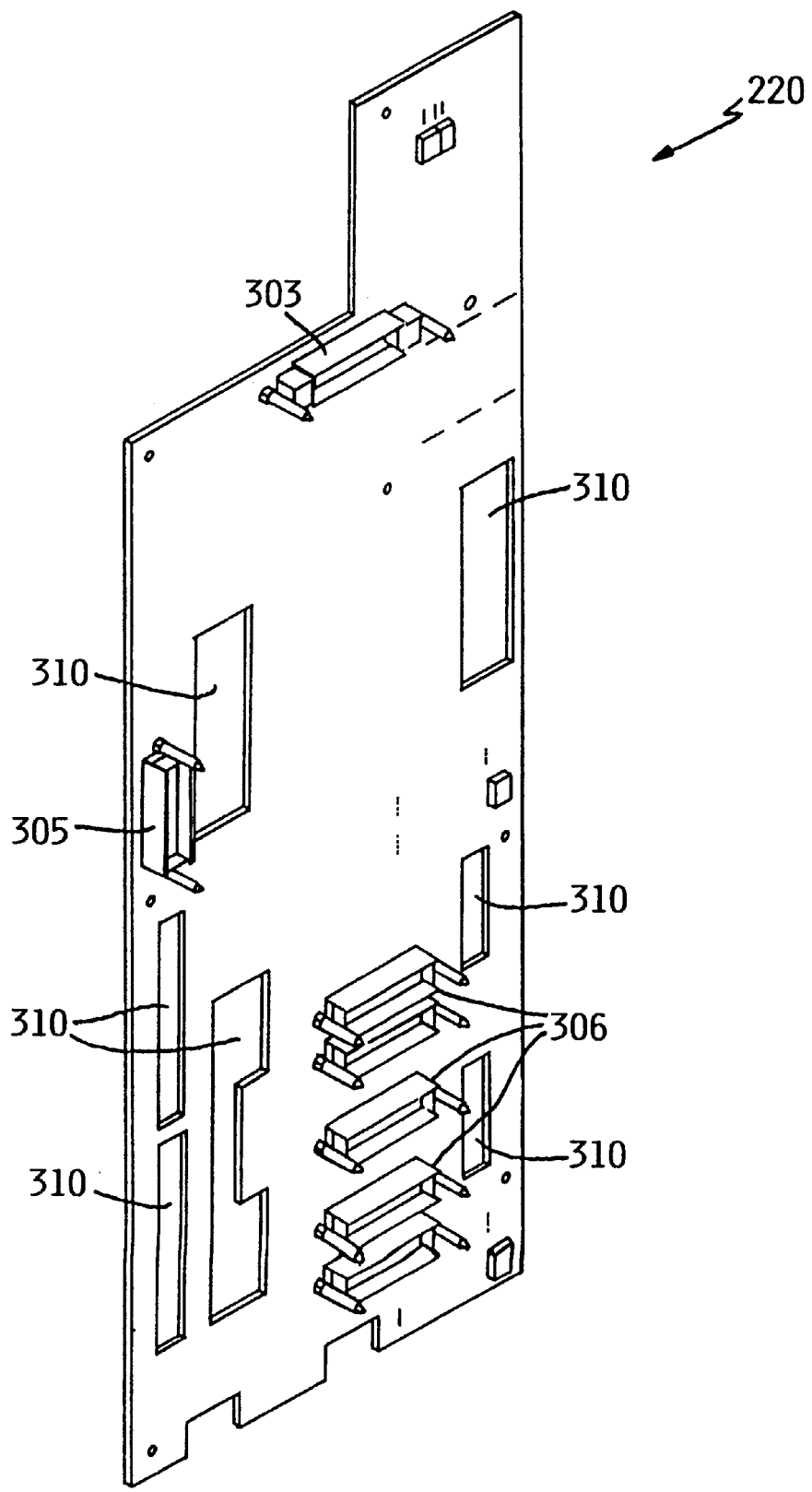
FIGS. 3A and 3B are isometric perspective views of the left section backplane circuit card according to the preferred embodiment.
Figure 3B:
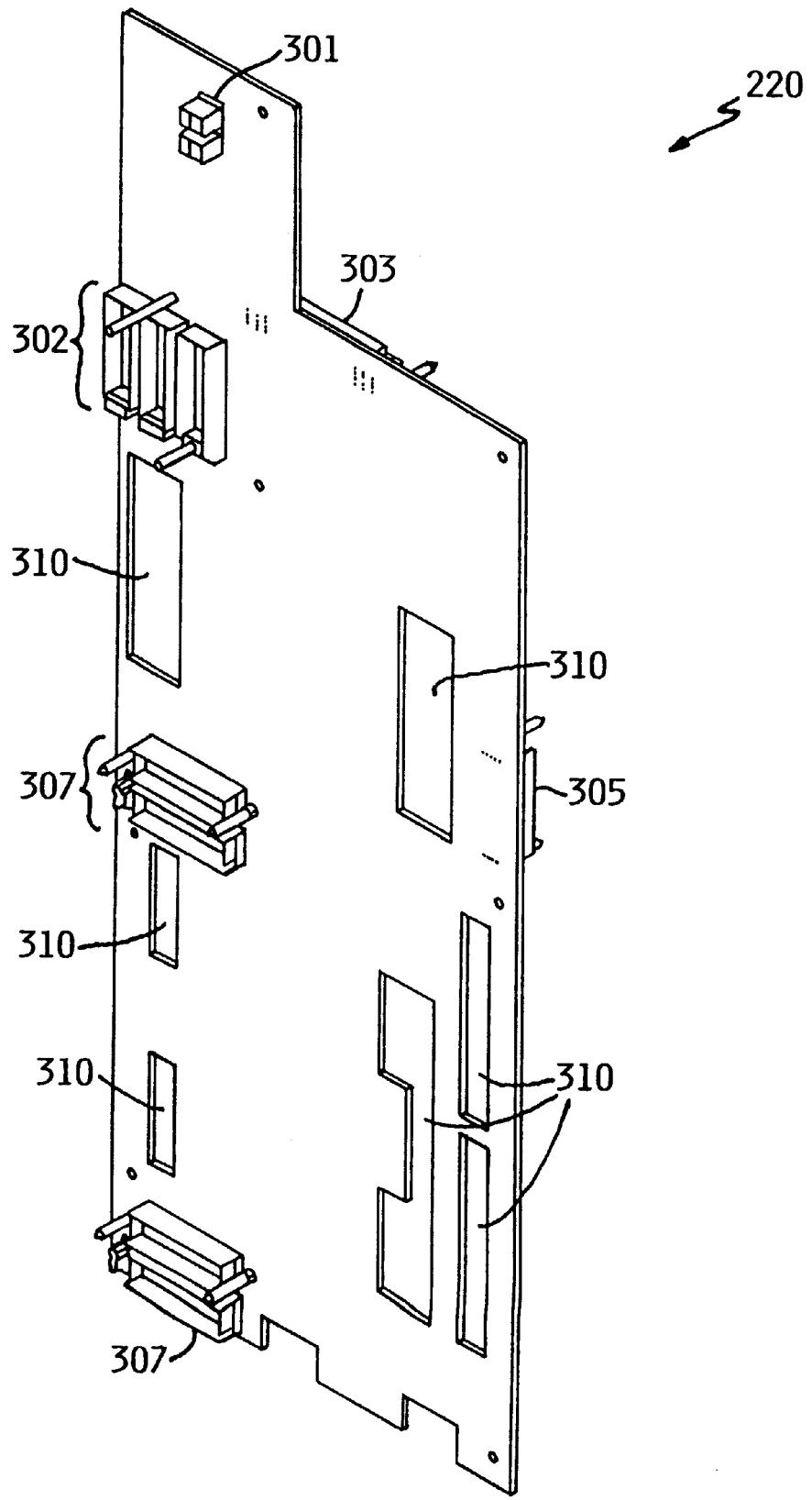

FIGS. 3A and 3B are perspective views of left section backplane circuit card 220 according to the preferred embodiment. FIG. 3A shows the front side of card 220, while FIG. 3B shows the back side. On the back side and near the top of card 220 can be seen a pair of power connectors 301. Beneath power connectors 301 is a set of three signal connectors 302. Power connectors 301 and signal connectors 302 mate with corresponding connectors 501 and 502 respectively on jumper card 222 to form the connection with the jumper card. Additional connectors mate with corresponding connectors on the various modules. Specifically, power supply connectors 303 mate with left power supply 201; card cage connectors 305 mate with connectors of a power supply (not visible) in left card cage 203 which provides power at working voltages and status information for main processor cards 241, memory cards 243, various V/O cards 245, etc.; I/O card connectors 306 mate with connectors in card cage 203 for the various I/O cards 245; and I/O module connectors 307 mate with the left I/O adapter modules 211 and 212. Embedded signal lines are formed in a plurality of conductive planes in circuit card 220, running between the various connectors. Holes 310 in card 220 allow cooling air to pass through the backplane.

Figure 4A:
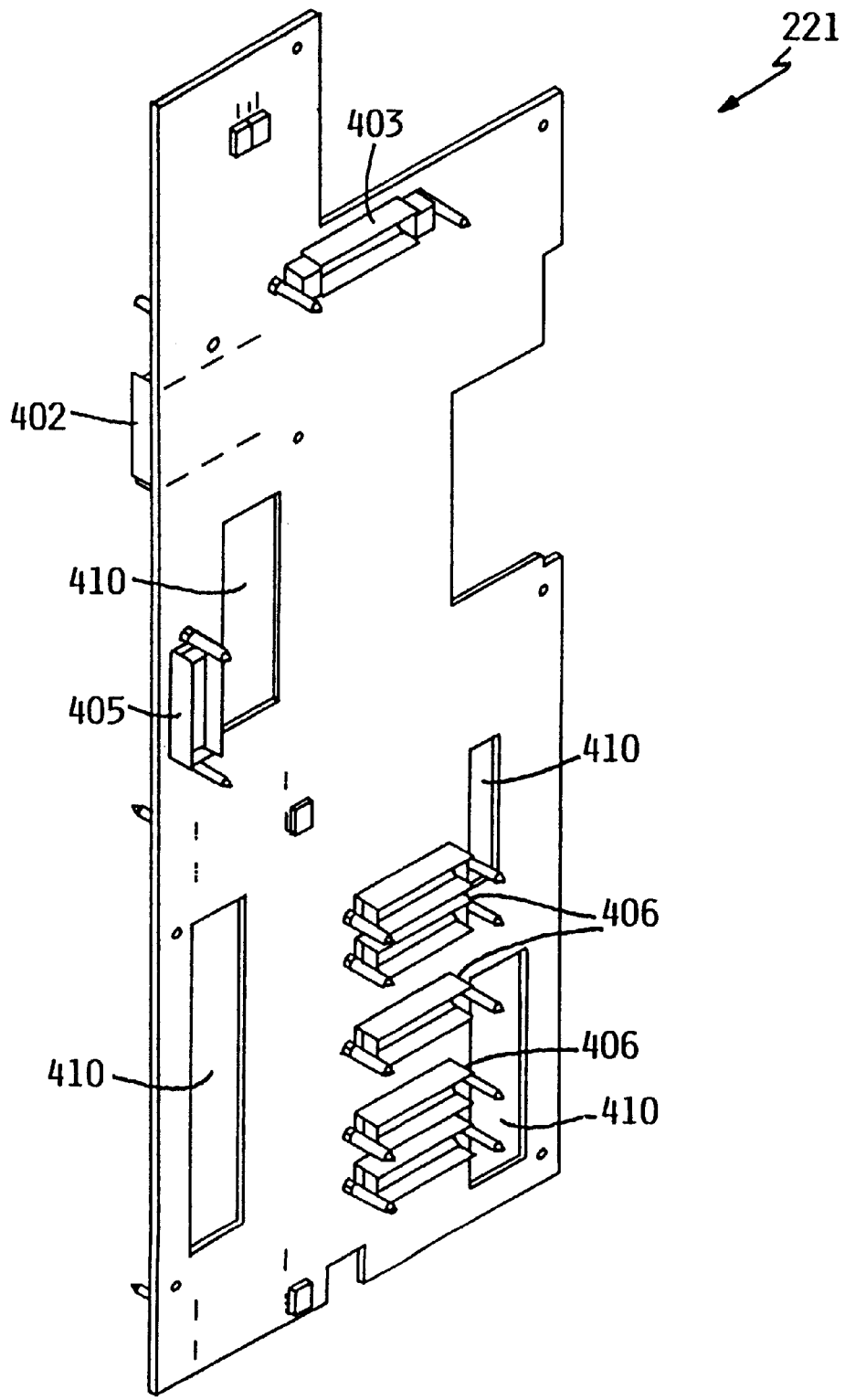
FIGS. 4A and 4B are isometric perspective views of the right section backplane circuit card according to the preferred embodiment.
Figure 4B:
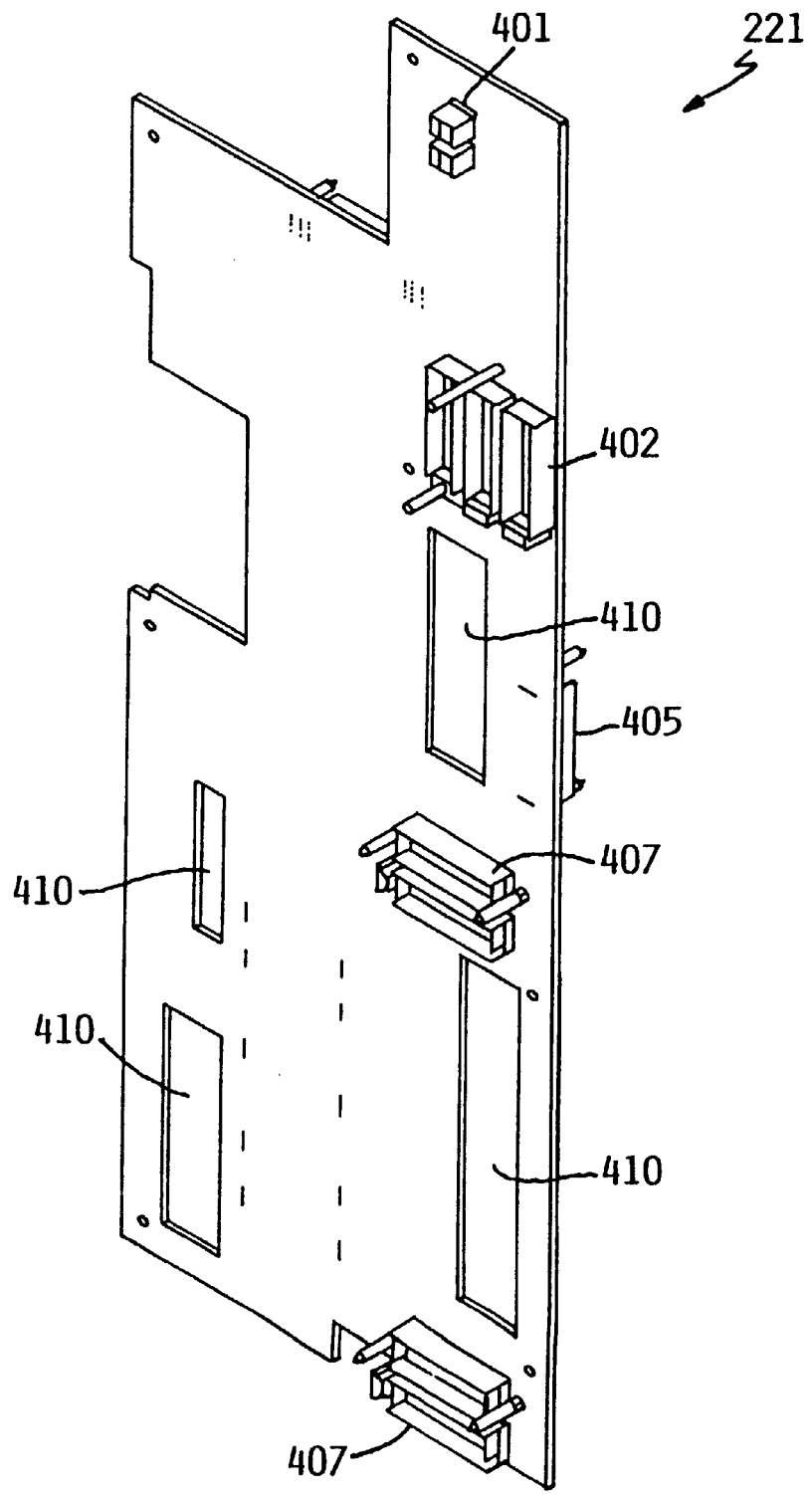

FIGS. 4A and 4B are perspective views of the right section of backplane circuit card 221, according to the preferred embodiment. Circuit card 221 is generally similar in construction and function to card 220. FIG. 4A shows the front side of card 221, while FIG. 4B shows the back side. Power connectors 401 and signal connectors 402 form connections to connectors 503 and 504 respectively of jumper card 222, similarly to left section card 220. Power supply connectors 403 mate with right power supply 202; card cage connectors 405 mate with connectors of a power supply (not visible) in right card cage 204 which provides power at working voltages and status information for main processor cards 242, memory cards 244, various I/O cards 246, etc.; I/O card connectors 406 mate with connectors in card cage 204 for the various I/O cards 246; and I/O module connectors 407 mate with right I/O adapter modules 209 and 210. Embedded signal lines are formed in a plurality of conductive planes in circuit card 221, running between the various connectors. Holes 410 permit the passage of cooling air.

Figure 5A:
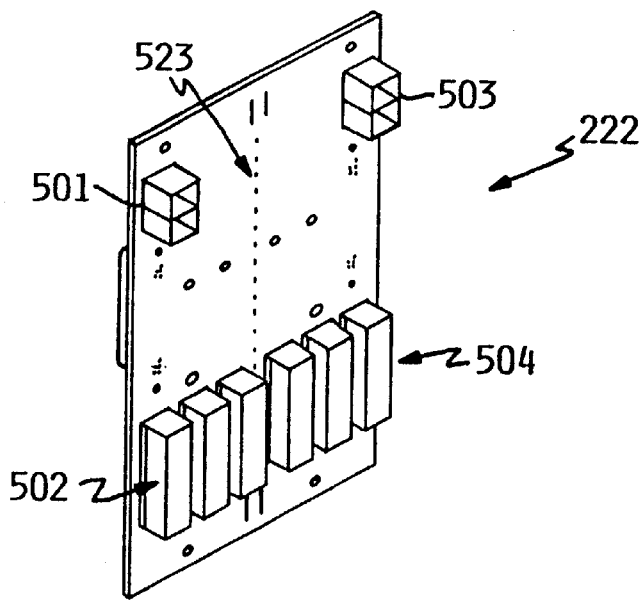
FIGS. 5A and 5B are isometric perspective views of the jumper section circuit card, according to the preferred embodiment.
Figure 5B:
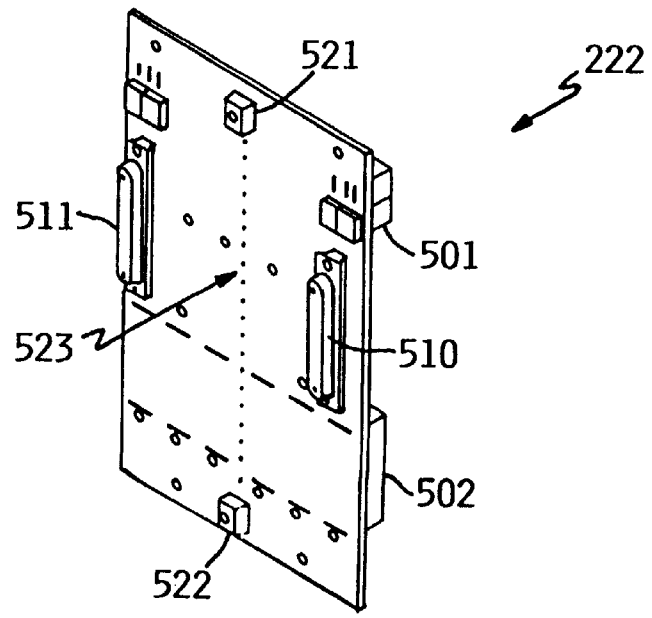

FIGS. 5A and 5B are perspective views of jumper section circuit card 222, according to the preferred embodiment. Jumper section is located in the center of electronics drawer 102, straddling the two circuit cards 220, 221. Power connectors 501 and 503 are electrically connected to each other via embedded power planes to transmit power between the connections to left section 220 and right section 221 respectively. Various pins in signal connectors 502 and 504 are likewise electrically connected to each other via a plurality of discrete embedded signal lines in jumper card 222, providing a communications path for data and other signals between the left and right circuit cards. Ground plugs 521 and 522 provide redundant locations for the attachment of a ground bus to the frame of drawer 102, which is in turn grounded to frame 101.

Power monitor connectors 510 and 511 receive the mating connectors of corresponding redundant cables (not shown) which run between jumper 222 and redundant 350 VDC power supplies in power drawer 103. These connectors and cables do not carry power, but carry data signals used for monitoring and regulating power. Specifically, power is continually regulated so that, under normal operating conditions, power supply 201 provides all power to modules attached to circuit card 220, while power supply 202 provides all power to modules attached to circuit card 221. The power provided by these power supplies is thus balanced, so that no power current is flowing through the jumper from one half of the backplane to another. However, where one power supply fails, its redundant neighbor will supply power to the other half of the backplane through the jumper.

Each of cards 220, 221 and 222 comprise multiple alternative electrically conductive and non-conductive layers. These layers are constructed using any of various conventional methods known in the art. Non-conductive layers are constructed of a suitable fiberglass epoxy material. Conductive layers are constructed of copper foil, which is etched, drilled, or otherwise formed to an appropriate pattern. Conductive layers can be broadly divided into two categories: (a) signal layers, and (b) power and ground layers. Signal layers typically contain conductive patterns in the form of many relatively narrow electrically isolated signal lines, each line running between two or more locations (such as pins or vias) in the plane. Power and ground layers typically contain only a single electrical pattern for supplying voltage and/or providing impedance matching. A power or ground layer is typically a broad sheet of substantially uniform thickness and conductivity occupying nearly all of the surface area of the plane, with only small areas around pins or vias removed to insulate the pin or via from the voltage of the power/ground layer.

Figure 6:
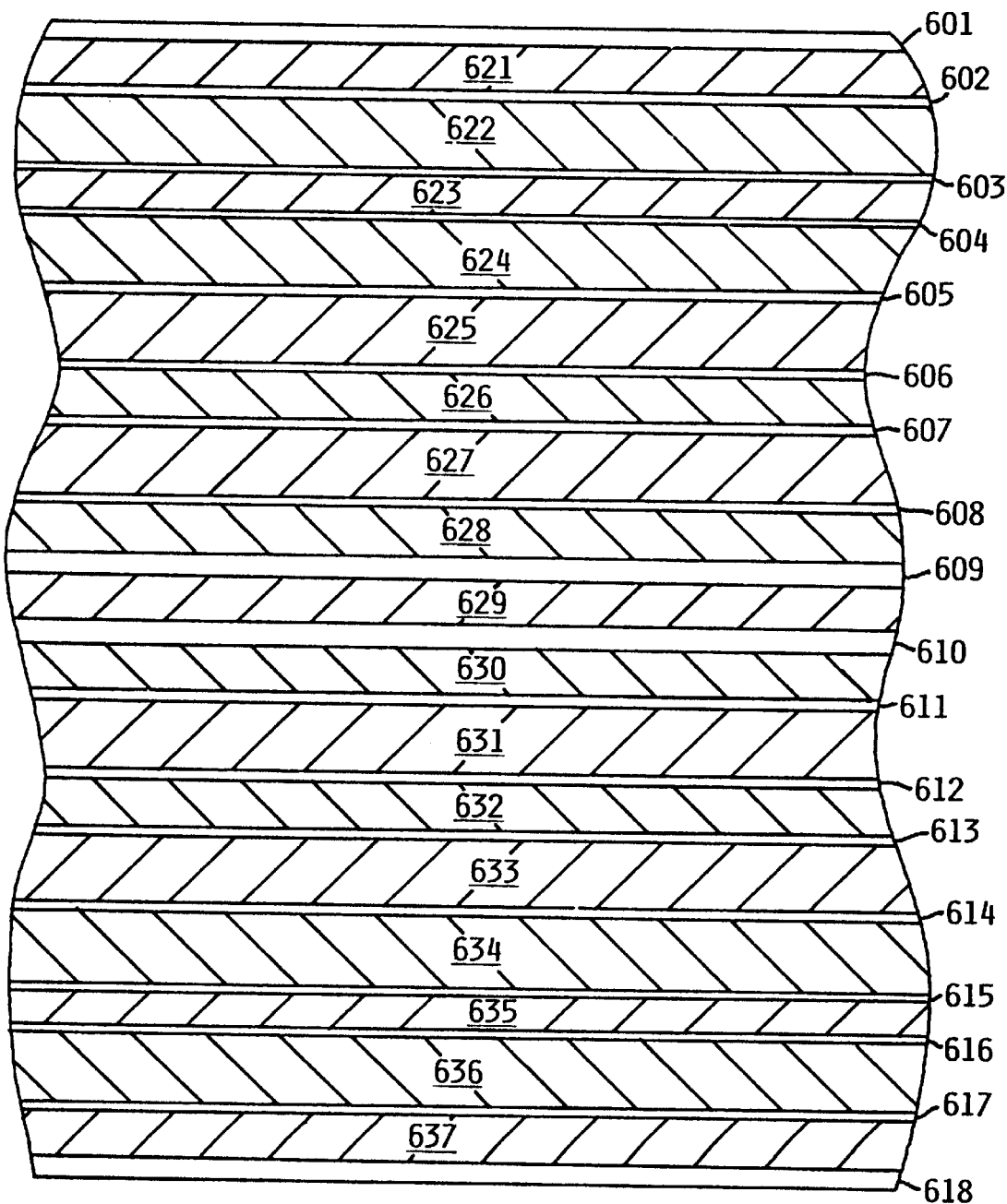
FIG. 6 is a cross-sectional view of a representative portion of one of the backplane circuit cards, showing the various conductive and non-conductive layers, according to the preferred embodiment.

FIG. 6 is a cross-sectional view of a representative small portion of one of backplane circuit cards 220, 221 or 222, according to the preferred embodiment. Conductive layers 601–618 alternate with non-conductive (dielectric) layers 621–637. Layers 603, 604, 606, 607, 612, 613, 615, and 616 are internal signal layers, i.e., signal layer planes which are buried in the middle of the circuit card. Layers 601 and 618 are signal layers lying on either surface of the card. Ground layer planes 602, 605, 608, 611, 614 and 617 provide impedance control for adjacent signal layers.

In the middle of the card lie two power layer planes 609, 610. Power plane 609 carries +48 VDC power supply voltage, while power plane 610 is 0 VDC power return voltage. While the grounds are also nominally 0 V, plane 610 is different from the ground planes because plane 610 carries substantial DC electrical current required for providing power to the various modules. Accordingly, both power planes 609 and 610 are substantially thicker than the signal planes or the ground planes. Specifically, in the preferred embodiment, internal signal planes and ground planes have a nominal design thickness of 0.03 mm, while power planes 609 and 610 have a nominal design thickness of 0.064 mm. Surface signal planes 601 and 618 are thicker than internal signal planes, having a nominal design thickness of 0.058 mm.

Each plane is depicted in FIG. 6 as a continuous, uniform thin sheet for purposes of illustrating the relative locations and thicknesses of the layers only. It will be understood that in fact discontinuities exist in various places, and particularly that signal layers comprise multiple discrete lines which are not shown in FIG. 6. Furthermore, it will be understood that various vias exist in cards 220–222 for connecting one plane with another. Signal vias generally connect a signal line in one plane with a signal line in another plane. Generally, for each signal via there is also an adjacent ground via which connects the ground plane adjacent the plane of one signal line with the ground plane adjacent the plane of another signal line, for impedance matching purposes.

Except in jumper 222, ground vias are insulated from the 0 VDC power plane. I.e., on cards 220 and 221, ground planes 602, 605, 608, 611, 614 and 617 are not electrically connected to 0 VDC power plane 610. The tying of 0 VDC power to ground is accomplished in jumper 222. Specifically, ground plugs 521 and 522 include pins extending through the width of jumper 222, which are electrically connected to each ground plane and to 0 VDC. Additionally, a row of ground vias 523 runs down the center of card 222 between plugs 521 and 522, each via electrically connecting all ground planes and the 0 VDC power plane. Each ground plane within the left 220 or right 221 half backplane is electrically connected to its corresponding ground plane in jumper 222 through pins in connectors 302, 402, 502 and 504. Thus, the 0 VDC is electrically isolated from the ground planes everywhere on the backplane assembly except down the middle of the jumper (by "electrically isolated", it is meant that there exists no direct electrical connection having negligible impedance, although there may be current paths through components having significant though finite impedance).

Because jumper 222 is substantially symmetrical, and power is balanced between the two halves of the backplane as described above, the power plane voltage potential along row of vias 523 and ground plugs 521, 522, should be equal. Thus, any recirculating electrical current due to ground loops is effectively minimized. For purposes of minimizing ground loop current, this design is similar to a single point of grounding the 0 VDC power plane.

Figure 7:
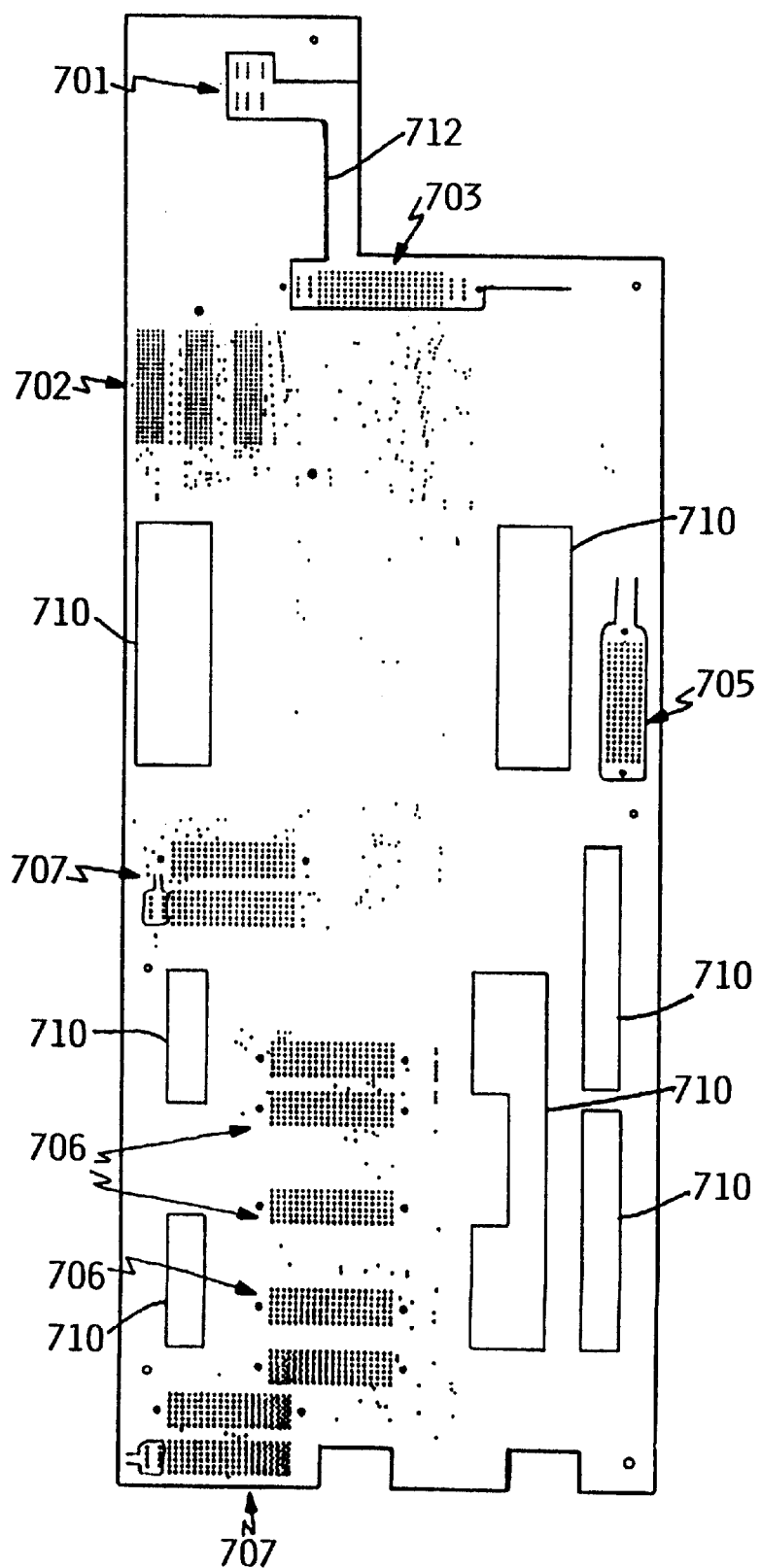
FIG. 7 is a view of a voltage power plane for left section backplane circuit card, showing the location of islands and power ramps, according to the preferred embodiment.

FIG. 7 is a view (from rear) of a power plane for left section circuit card 220. As can be seen by comparing FIG. 7 to FIGS. 3A and 3B, the power plane generally follows the contours of card 220, and contains air flow holes 710 corresponding to holes 310 in card 220. The power plane includes a plurality of smaller holes for connector pins, which appear in FIG. 7 as rectangular groups or arrays of black dots. Some of these holes are slightly larger than corresponding physical pin holes in the card, creating a small insulating void around the pin to electrically isolate the pin from the power plane. At other pin holes, the plane extends all the way to the pin hole, creating an electrical contact with the pin when the hole is filled with solder during assembly of the circuit card. Additional isolated scattered holes may be signal via holes or mounting holes.

Both the +48 VDC power plane and the 0 VDC power plane for a particular circuit card are nearly identical. Both planes are identical with respect to the outer edges, the locations of all via holes for signal vias, ground vias and power vias of other voltages, all mounting and cooling holes, and the edges of all non-conductive voids which define the boundaries of ramps and islands. The only differences between the two planes are the identity of particular connector pin locations which are electrically coupled or insulated. I.e., each via which forms a fill or connection with one power plane is always surrounded by an insulating void at the other power plane. These differences are too small to see in FIG. 7, and so FIG. 7 may be regarded as either the +48 VDC plane or the 0 VDC plane. The same observations are true of FIGS. 8 and 9, further described below.

Hole group 701 corresponds to power connector 301, each hole accommodating a respective pin from the connector. Hole group 702 corresponds to signal connector 302 to jumper. Similarly, hole groups 703, 705, 706 and 707 correspond to connectors 303, 305, 306 and 307, respectively.

To the left of each of hole groups 707 will be seen a horseshoe shaped line surrounding two columns of holes. A similar but much larger structure surrounds hole group 705. These lines represent voids in the power plane. These voids effectively create small conductive areas in the vicinity of the holes, which are isolated from the rest of the power plane at most of their perimeter, and electrically coupled to the power plane only at a relatively narrow connecting area. These conductive areas are referred to herein as "islands", and the narrow connecting areas as "ramps". The main portion of the power plane, which surrounds the islands, is referred to as the "body". The body of the plane distributes current among the islands. Specifically, it distributes power from the power supply island to the islands associated with the various power consuming modules, including the card cage (the direction of current flow depending on the polarity of the voltage in the power plane).

Void 712 nearly surrounds hole groups 701 and 703, and defines a ramp to the right of group 703. The comparatively large island defined by this void encompasses all the power supply connections. I.e., hole group 703 corresponds to the connector to power supply 201, which normally supplies power to backplane section 220. In the event of failure or absence of supply 201, power to backplane section 220 is provided by power supply 202, through the connections in jumper card 222. This power is routed through power connector 301, corresponding to hole group 701. Thus the power to card 220 is always routed through the island defined by void 712, regardless of which power supply is actually providing it. Conversely, if power supply 202 should fail, requiring power supply 201 to double its output in order to supply the power needs of card 221 and its attached modules, the additional current is routed through the island defined by void 712, without traversing the body of the power planes in card 220.

The island and ramp configuration is used around pins which are electrically coupled to one of the power planes. These are the connections which supply electrical power to the modules. Because power is being supplied to modules through these pins, they normally conduct a relatively high electrical current in comparison to pins used for transmitting data signals. It will further be observed that typically an array of power pins is contained in each island, although only two electrical voltages (+48 VDC and 0 VDC) are used for power distribution. Multiple pins are used to supply power from the same power plane, through the same connector, to the same module. This is done in order to reduce the electrical current through each individual pin.

Figure 8:
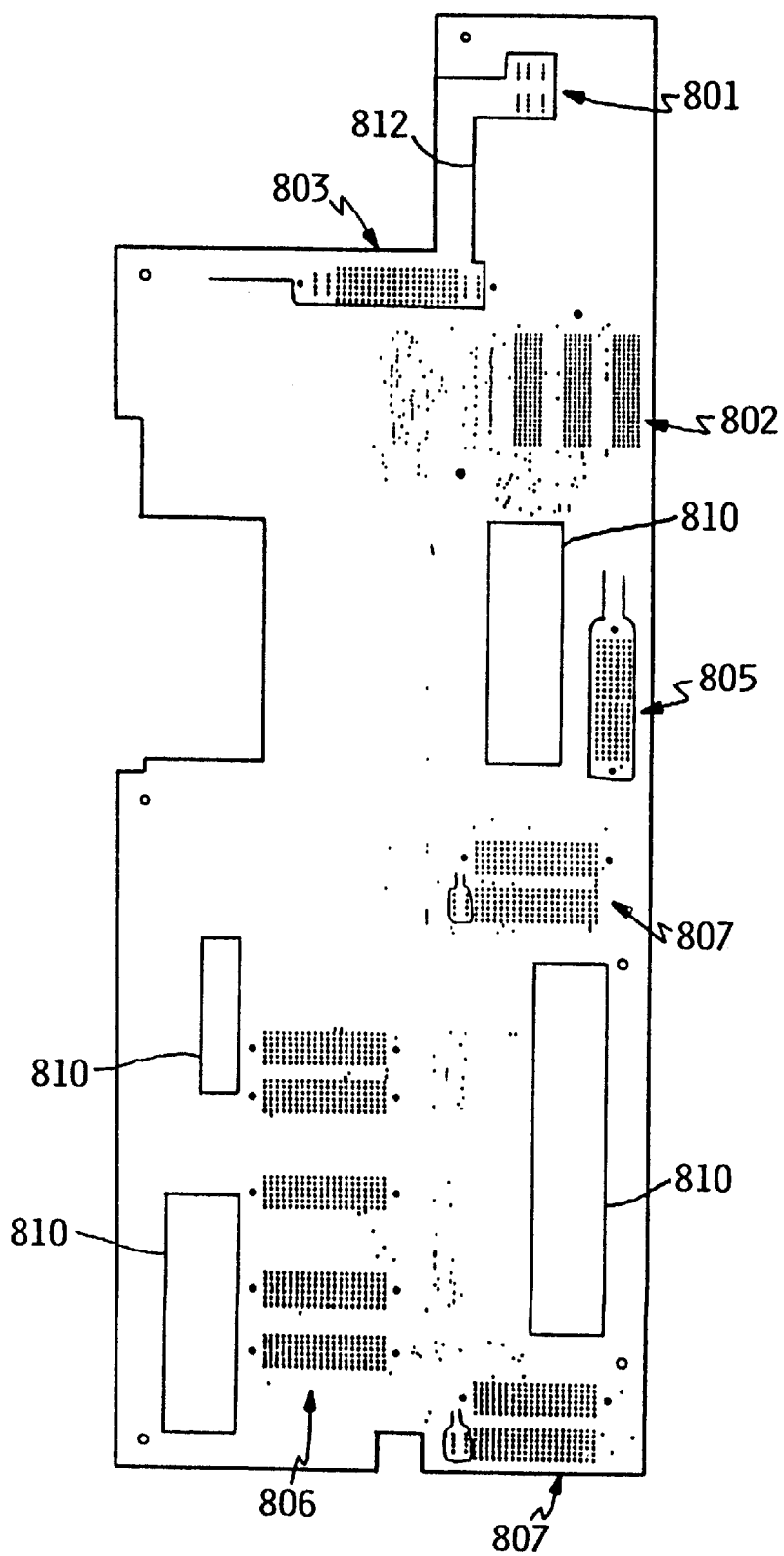
FIG. 8 is a view of a voltage power plane for right section backplane circuit card, showing the location of islands and power ramps, according to the preferred embodiment.

FIG. 8 is a view of a power plane for right section circuit card 221. As can be seen by comparing FIG. 8 to FIGS. 4A and 4B, the power plane generally follows the contours of card 221, and contains air flow holes 810 corresponding to holes 410 in card 221. The general construction and layout is similar to that of left card 220. As in the case of the power plane for left circuit card 220, the power plane for right card 221 includes a plurality of smaller holes for connector pins, which appear in FIG. 8 as groups or arrays of black dots, some of which depict insulating voids while others depict connections to the via.

Hole group 801 corresponds to power connector 401, each hole accommodating a respective pin from the connector. Hole group 802 corresponds to signal connector 402 to jumper. Similarly, hole groups 803, 805, 806 and 807 correspond to connectors 403, 405, 406 and 407, respectively.

Horseshoe shaped voids defining islands and ramps will be seen near hole groups 807, and surrounding hole group 805. Similarly to left card 220, void 812 defines a single large island and ramp encompassing hole groups 801 and 803, which correspond to the power connectors.

Figure 9:
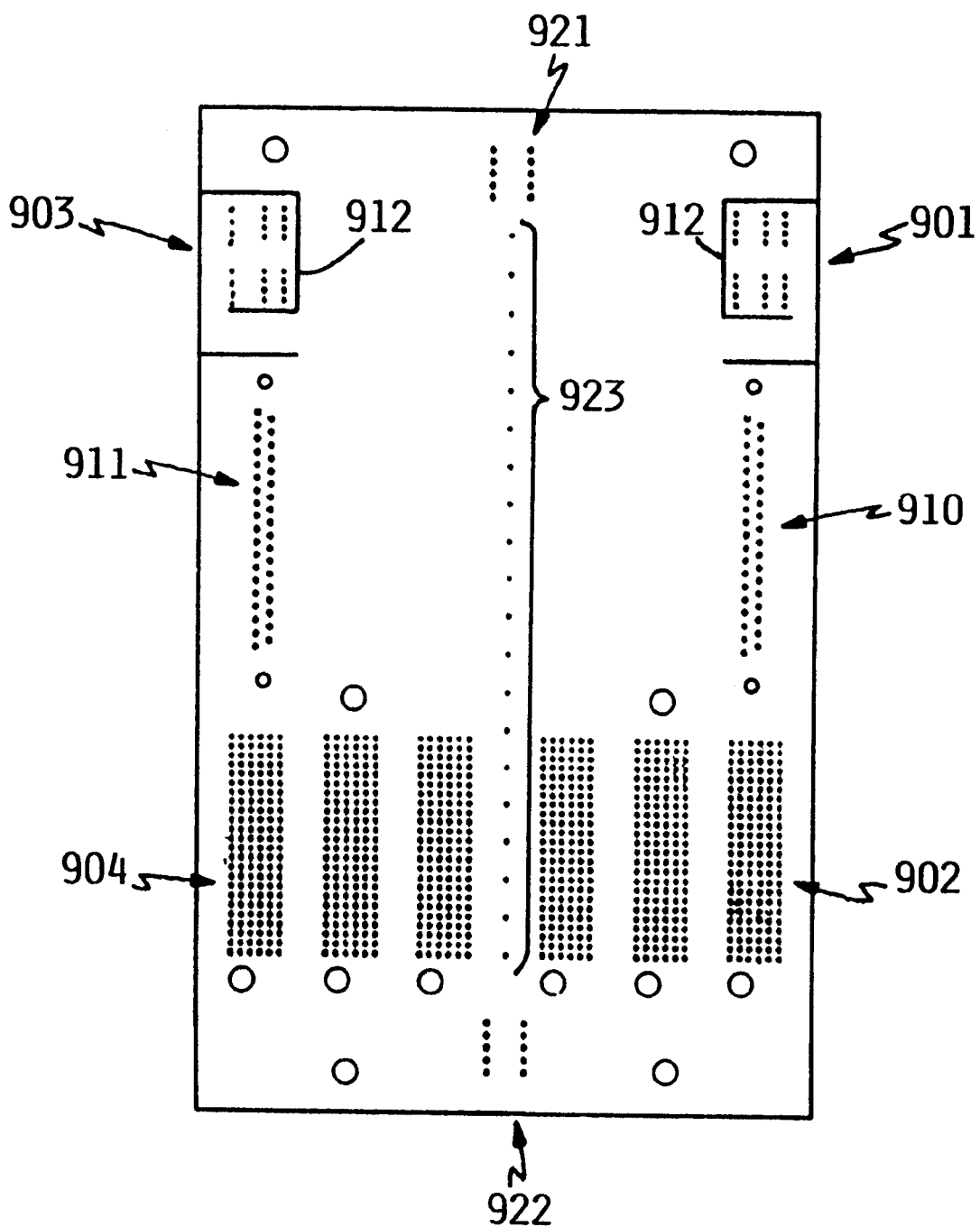
FIG. 9 is a view of a voltage power plane for jumper section circuit card, according to the preferred embodiment.

FIG. 9 shows a power plane for jumper section 222. As can be seen be comparing FIG. 9 to FIGS. 5A and 5B, the power plane is the same shape as jumper card 222, and contains connector pin holes corresponding to the various features of the jumper, which appear as black dots on the power plane of FIG. 9. Hole group 901 corresponds to power connector 501, each hole accommodating a respective pin from the connector. Hole group 803 corresponds to power connector 503 for the opposite side. Similarly, hole groups 902, 904, 910, 911, 921 and 922 correspond to connectors 502, 504, 510, 511, 521 and 522, respectively. Surrounding power hole groups 901 and 903 are respective voids 912 defining islands and ramps.

A row of holes 923 runs down the middle of the power plane, corresponding to grounding vias 523. On the 48 VDC power plane, all these holes are insulated from the via. On the 0 VDC power plane, all these holes represent connections to the grounding via, which electrically connects the 0 VDC power plane with the various ground planes. Similarly, hole groups 921 and 922 also represent grounds, being connected to the chassis ground and to each ground plane. In the 48 VDC power plane, hole groups 921 and 922 are insulated from the pins within, while in the 0 VDC power plane, these hole groups represent electrical connections to the pins.

The island and ramp configuration helps to reduce the effect of transients, particularly those caused by unplugging or plugging a module. For example, without the island and ramp, if a module which is powered on (i.e., receiving power) is suddenly unplugged from the backplane, so that power is abruptly disconnected, there is a sudden large change in the electrical current density function for the power plane, which is particularly acute in the vicinity of the pins which supply power to a module. Similarly, plugging a powered-off module into the backplane causes a large current spike (and possible arcing) as a result of sudden application of voltage to what is effectively a large discharged capacitor. The resulting induced magnetic field can corrupt data signals in one or more of the signal planes.

The island and ramp configuration reduces these effects in several ways. The two power planes are preferably of identical patterns (except at connections to the power pins), separated by a single dielectric layer. Channelling all the current through power ramps which are mirrored in the two power planes causes a high degree of coupling of pairs of power ramps in different respective planes, significantly reducing electromagnetic field effects of the current surges. Moreover, the use of power ramps themselves slows the change in current by increasing the impedance of the plane in the vicinity of the pins.

Figure 10:
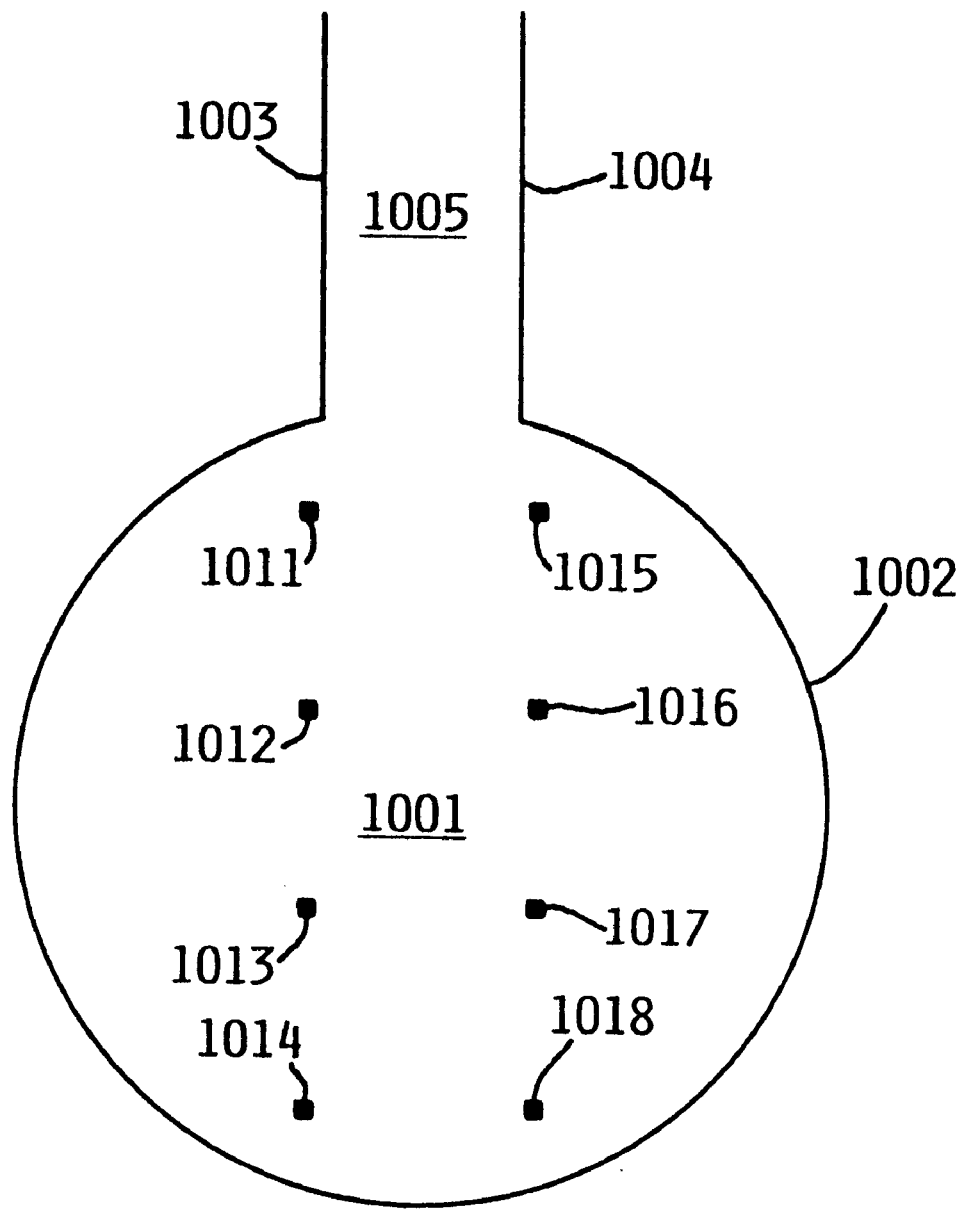
FIG. 10 is enlarged partial view of a voltage power plane, showing a typical island and power ramp in greater detail, according to the preferred embodiment.

FIG. 10 illustrates a typical island, ramp and pin connections. Island 1001 is the area defined by a circular void pattern 1002, having an opening and parallel voids 1003, 1004 extending from the opening. The area between parallel voids 1003, 1004 is the ramp 1005. In this example, eight power pin holes 1011–1018 are within island 1001, each hole corresponding to a connector pin used for transmitting electrical power. Pins through four of the holes 1011–1014 provide power at the voltage of the plane containing island 1001, and are therefore electrically coupled to island 1001. The remaining four pins through holes 1015–1018 are electrically insulated from island 1001, and electrically coupled to a mirror image of island 1001 in the other power plane.

Preferably, certain parameters are observed in the design of islands and ramps. The length of ramp 1005 (i.e., the length of either void 1003 or 1004) is preferably the greater of either: (a) the distance between ramp 1005 and the nearest power pin hole 1011; or (b) twice the width of ramp 1005. The width of ramp 1005 is determined by the acceptable temperature rise in the power layers due to the current density, i.e., ramp 1005 is made as narrow as possible given the constraints of current and temperature rise. The shape of the island is not particularly significant; although a circular island is shown in FIG. 10, the island could be oblong, rectangular, or other shapes. The ramp is preferably of constant width, and surrounds no vias, mounting or cooling holes.

In order to maximize electromagnetic coupling between the two power layers 609, 610, it is not only preferable that they be of substantially identical patterns (except at the power pin connections), but that the physical distance (i.e., dielectric layer 629) between the two power planes be as small as possible, without risking dielectric breakdown. Furthermore, in order to isolate the signal planes from power planes, it is preferred that ground planes 608, 611 be placed on either side of the pair of power planes, and that the insulating layers in this region be relatively thick. However, in the design of any circuit card, these parameters must be regarded as goals rather than absolutes, and it is recognized that other design constraints may impose countervailing requirements.

For example, in the backplane circuit card of the preferred embodiment, dielectric layer 629 separating the two power planes is approximately 0.124 mm thick. This is actually only slightly thinner than some other dielectric layers in the circuit card, but in view of the fairly large power load being carried by the power planes, such a dimension is deemed desirable. Where a card is used to distribute smaller power loads or other parameters are different, it may be possible to design a thinner insulating layer between the power planes. Dielectric layers 628 and 630, separating the power planes from ground planes 608 and 611, are each approximately 0.130 mm thick, while dielectric layers 627 and 631, separating ground planes 608 and 609, respectively, from adjacent signal planes, are each approximately 0.188 mm thick. These dimensions do not necessarily represent an ideal from the standpoint of electromagnetic transient isolation, but were chosen in order to achieve other goals as well, such as manufacturability and cost.

Each pair of matching islands in the two power planes surrounds all the +48 VDC and 0 VDC connections to a particular module. Accordingly the amount of current carried by each island is exactly the same as the current carried by the matching island in the other voltage plane. Because the conductive path through the ramp is relatively long and narrow, asymmetrical current distribution within the island is largely dispersed by the time current reaches the opening at the end of the ramp to the body of the power plane, and current densities are these locations of the two power planes are equal in magnitude and opposite in direction. Because the bodies of the two power planes are dimensionally nearly identical, and current densities at the openings to the power ramps are equal in magnitude yet opposite in direction, current densities remain equal in magnitude and opposite in direction everywhere within the body of the power planes.

Because electromagnetic effects are reduced by coupling the two power layers, it is important that the magnitude of current in each be the same. Therefore, all return current to the power supplies should be carried in the 0 VDC power plane 610. Any current leakage into the ground planes 602, 605, 608, 611, 614 and 617 reduces the effectiveness of coupling the two power layers.

In order to further improve resistance to transients, it is preferred that islands and ramps be kept relatively small, and that signal lines avoid passing directly over or under the islands and ramps, to the extent possible. It is within the islands that the current densities will be asymmetrical, producing the largest resultant electromagnetic forces during rapid current changes, e.g., as caused by hot plugging. To this end, these areas may be designated "keep outs" during design of the signal planes. I.e., signal wires are not routed through such areas.

Figure 11:
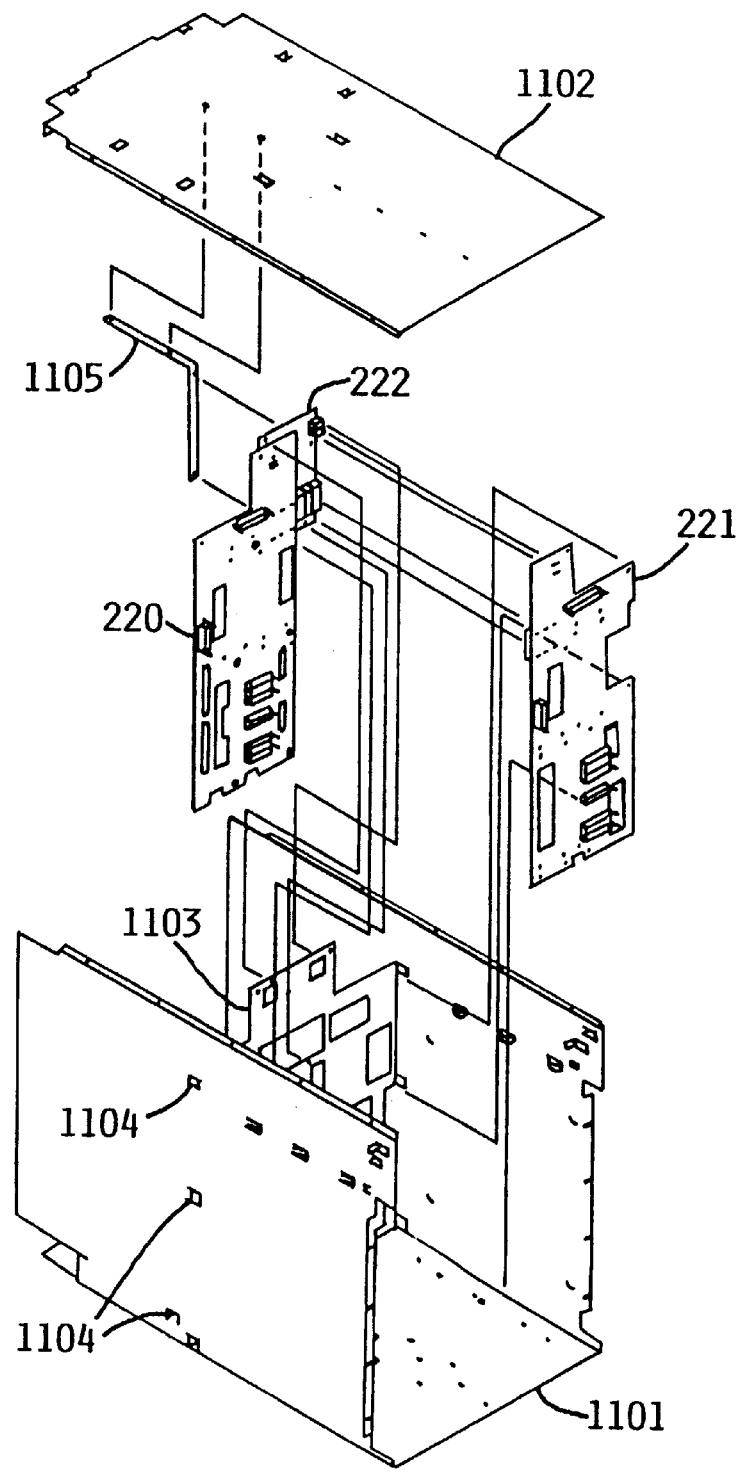
FIG. 11 is an exploded perspective view of the mounting frame for the electronics drawer, showing the mounting locations of the backplane circuit card assembly, according to the preferred embodiment.

FIG. 11 is an exploded perspective view of the mounting frame and associated hardware for electronics drawer 102, according to the preferred embodiment. The mounting frame includes U-shaped bottom-and-side section 1101 and top section 1102, both of which are formed sheet steel containing appropriate mounting holes, tabs and other features. The backplane assembly, comprising cards 220, 221 and 222, is positioned approximately in the center of section 1101, perpendicular to the sides and bottom. A sheet steel stiffener 1103 is attached to section 1101, and positioned parallel to cards 220, 221 and 222. Stiffener 1103 contains holes for cooling airflow corresponding to the various holes in cards 220 and 221. Stiffener 1103 also contains holes for various connectors mounted on cards 220, 221 and 222. Cards 220 and 221 are mounted on the front side of stiffener 1103, while card 222 is mounted on the rear side. Thus, stiffener 1103 lies in a plane between the jumper and the two functional halves. A thin plastic insulator (not shown) prevents electrical contact between cards and stiffener.

Cards 220 and 221 are mounted to stiffener 1103 and section 1101 with screws, at the locations indicated. Screws along the sides of section 1101 are installed through holes in cards 220, 221 and stiffener 1103, threading into tabs 1104 on section 1101. Either card 220 or 221 can be removed independently of the other, by first sliding all modules in its respective half of the drawer out the front or rear, unscrewing the mounting screws from the stiffener and section 1101, and then pulling the card forward, thereby disconnecting it from the jumper.

Grounding bus bar 1105 forms a frame ground for the backplane assembly. Ground bar 1105 is attached to jumper 222 via screws at plugs 521 and 522, the two screw locations providing redundant attachment to the jumper. Bar 1105 is also attached to top section 1102 via two redundant screws. This arrangement of ground bar 1105 also provides additional structural support to the backplane circuit card assembly.

In the preferred embodiment described above, the backplane assembly contains three separable parts (sections 220, 221 and 222), which are joined by pluggable connectors. This design permits concurrent maintenance of the two major backplane sections. However, it would alternatively be possible to employ a unitary backplane circuit card in which the ground vias are located on a dividing axis. In such a case, it may be desirable (though not always necessary) to narrow the region in which the ground vias are located. For example, non-conductive voids located along the axis could divide the power planes into two halves, joined only along part of the length of the axis, the ground vias being located in this region.

In the preferred embodiment, each 48 VDC power supply is allocated to one of the halves of the backplane and under normal conditions supplies all its power. However, various redundant and non-redundant alternatives are possible. A single power supply could be connected to both halves of the backplane at symmetrical locations with respect to the axis. Alternatively, a pool of two or more redundant power supplies could be coupled to a common power bus, each half of the backplane having its independent connection to the bus, so that no one power supply is directly associated with any section of the backplane. It would further be possible to have multiple redundant power buses.

In the preferred embodiment described above, jumper card 222 is non-redundant and constitutes a possible single point of failure for the system. Because jumper 222 contains no attached components other than connectors (contains no active devices, resistors, capacitors, etc.), the probability of jumper failure is considered extremely low, and accordingly this portion of the system is non-redundant. However, it would have alternatively been possible to design the system in such a way that the jumper itself could be concurrently maintained and replaced. There are several ways in which this could have been done. It would have been possible to construct the backplane with a second jumper card, located between the left and right circuit cards below jumper 222. In this case, it would not have been necessary to place both power monitor connectors 510 and 511 on jumper 222; one such connector would be on jumper 222, while the other would be on the second jumper (the system being capable of operation with only one such power monitor connection). Another alternative would have been to relocate power monitor connectors 510 and 511 to the left and right circuit cards respectively, and construct a second jumper card having extremely limited function. I.e., the second jumper would only contain the ground vias connecting the 0 VDC, ground planes, and chassis ground, without any transmission of data. Because each half of the backplane is independently capable of supporting a system, data running between the two halves is not necessary for minimal operation. However, in any implementation which would disrupt communications between the two halves during concurrent maintenance, it would be necessary for control software to temporarily shut down one half of the system or otherwise guarantee resynchronization of the two parts of the system after data communication is restored.

In the preferred embodiment, the power planes are located in the middle of the various layers which make up the circuit card, with signal planes located on either side of the power planes. This arrangement buries the power planes far from components on either side of the backplane. However, it would alternatively be possible to locate the power planes near a surface of the card, with all signal planes being located to one side of the power planes. This arrangement may prove advantageous if, e.g., connectors and other components are located on only one side of the backplane.

In the preferred embodiment, the backplane is used only for distribution of power and signals among pluggable components, and itself contains no active functional electronic components. However, it would alternatively be possible to construct a backplane assembly as described herein, which also carries functional components such as processors, switches, programmable logic arrays, etc. If redundancy is desired, it may be necessary to duplicate functional components on different sections of the backplane.

In the preferred embodiment, a backplane circuit card for power distribution is designed to pluggably receive both the modules which supply power and the modules which consume power. However, it would alternatively be possible to construct systems in which any single backplane receives only modules of a single type. For example, a backplane may have several pluggable couplings for receiving disk drive modules (consumers of power), and be connected by flexible cable or any of various other conventional connection means to one or more power supplies, or to a second backplane into which one or more power supplies are plugged.

In the preferred embodiment, a pair of power planes is used to distribute power at a voltage somewhat higher than normally used by semiconductor circuits. The higher distribution voltage (48 volts) reduces current in the distribution medium. It is expected that each module will have circuitry necessary to produce working voltages such as 5 volts. However, it would alternatively be possible to construct a system in which all working voltages are distributed on the power planes, or in which a combination of higher distribution voltages and working voltages are distributed on the power planes. In this case, more than two power planes may be necessary. For example, a backplane circuit card may have three power planes, for 0, +5 and +12 volts, each power plane having corresponding islands as described herein. As an alternative example, the backplane may contain power planes at +48VDC distribution voltage, 0 VDC return distribution voltage, +5 VDC working voltage, and 0 VDC return working voltage.

In the preferred embodiment, pins which carry power to or from the backplane are surrounded by islands and ramps in order to reduce the effects of transients during hot plugging. However, it would alternatively be possible to construct a backplane assembly as described herein without island or ramps. Such a backplane may be constructed, e.g., without pluggable power connections; or with power connections having other forms of transient suppression such as active circuit elements; or with power connections which are shut down before insertion and removal of modules so that hot plugging is not necessary; or employing a system design which in some other way modifies or tolerates transients resulting from hot plugging.

Although a specific embodiment of the invention has been disclosed along with certain alternatives, it will be recognized by those skilled in the art that additional variations in form and detail may be made within the scope of the following claims:

We claim:

1. An electronic system, comprising:
   a frame;
   at least one power supply module mounted within said frame for providing power to functional components of said system;
   a backplane circuit card assembly having first and second functional halves mounted within said frame, said functional halves consuming substantially equal power and being divided by an axis, said backplane circuit card assembly coupled to said at least one power supply module and distributing electrical power to functional components of said system, said backplane circuit card assembly comprising:
   a first embedded power plane for conducting a first voltage;
   a second embedded power plane for conducting a second voltage, said second voltage being associated with ground;
   a plurality of embedded ground planes;
   a first power connection within said first functional half for receiving power from said at least one power supply module;
   a second power connection within said second functional half for receiving power from said at least one power supply module, wherein said first and second power connections are symmetrically located with respect to said axis; and
   a plurality of ground vias located along said axis, each said ground via electrically connecting said plurality of embedded ground planes and said second embedded power plane;
   wherein said embedded ground planes are electrically isolated from said second embedded power plane at all locations within said backplane circuit card assembly except at said ground vias located along said axis.

2. The electronic system of claim 1, further comprising:
   a chassis ground electrically connecting said frame to said backplane card assembly, said chassis ground being connected to said backplane card assembly at at least one location along said axis.

3. The electronic system of claim 2, wherein said chassis ground comprises an L-shaped conductive bar, one leg of said bar being coupled to said backplane assembly at a plurality of locations along said axis, the other leg of said bar being coupled to said frame.

4. The electronic system of claim 1, wherein said backplane circuit card assembly comprises:
   a left base circuit card corresponding to said first functional half;
   a right base circuit card corresponding to said second functional half; and
   a jumper card mounted between and joining said left and right base circuit cards, said plurality of ground vias being located in said jumper card.

5. The electronic system of claim 1, wherein:
   said frame forms the outlines substantially rectangular parallelepiped;
   said backplane circuit card assembly is mounted substantially perpendicular to the top, bottom and sides of said frame, and dividing the interior of said parallelepiped into front and rear regions;
   a first plurality of electronic modules are mounted in said front region; and
   a second plurality of electronic modules are mounted in said rear region.

6. The electronic system of claim 5, wherein:
   said backplane circuit card assembly comprises a left base circuit card and a right base circuit card, said left and right base circuit cards being mounted within a left half of the interior of said parallelepiped and a right half of the interior of said parallelepiped, respectively;
   said system includes a plurality of left side electronic modules which plug into said left base circuit card, and a plurality of right side electronic modules which plug into said right base circuit card;

said plurality of left side electronic modules includes at least one left power supply module for supplying power to said left base circuit card; and said plurality of right side electronic modules includes at least one right power supply module for supplying power to said right base circuit card.

7. The electronic system of claim 1, further comprising:
a plurality of power supply modules, each power supply module being associated with a respective half of said backplane circuit card assembly and supplying power to the respective half with which it is associated.

* * * * *